(12) United States Patent
Reinhold et al.

(10) Patent No.: US 10,296,775 B2
(45) Date of Patent: May 21, 2019

(54) DEVICE AND METHOD FOR OPTICAL IMAGING OF PRINTS OF SKIN PARTS WITH BLOOD CIRCULATION

(71) Applicant: JENETRIC GmbH, Jena (DE)

(72) Inventors: Joerg Reinhold, Jena (DE); Dirk Morgeneier, Jena (DE); Roberto Wolfer, Jena (DE)

(73) Assignee: JENETRIC GmbH, Jena (DE)

( * ) Notice: Subject to any disclaimer, the term of this patent is extended or adjusted under 35 U.S.C. 154(b) by 0 days.

(21) Appl. No.: 15/260,209

(22) Filed: Sep. 8, 2016

(65) Prior Publication Data

US 2017/0132447 A1    May 11, 2017

(30) Foreign Application Priority Data

Sep. 11, 2015 (DE) .................. 10 2015 115 381

(51) Int. Cl.
*G06K 9/00* (2006.01)
*G06F 3/042* (2006.01)
*H01L 27/32* (2006.01)

(52) U.S. Cl.
CPC ........... *G06K 9/0004* (2013.01); *G06F 3/042* (2013.01); *G06K 9/0012* (2013.01); *G06K 9/00013* (2013.01); *G06K 9/00067* (2013.01); *G06K 9/00087* (2013.01); *G06K 9/00912* (2013.01); *H01L 27/3227* (2013.01)

(58) Field of Classification Search
None
See application file for complete search history.

(56) References Cited

U.S. PATENT DOCUMENTS

| 4,394,773 A | 7/1983 | Ruell |
| 5,325,442 A | 6/1994 | Knapp |
| 5,446,290 A | 8/1995 | Fujieda et al. |

(Continued)

FOREIGN PATENT DOCUMENTS

| DE | 199 58 378 A1 | 11/2000 |
| DE | 100 02 767 A1 | 7/2001 |

(Continued)

*Primary Examiner* — Kim Y Vu
*Assistant Examiner* — Nathan J Bloom
(74) *Attorney, Agent, or Firm* — Christensen, Fonder, Dardi & Herbert PLLC

(57) ABSTRACT

A device for capturing prints of areas of skin of human autopodia or parts thereof supplied with blood, including: a contact surface for placing on an area of skin; a composite containing a sensor layer with light-sensitive sensor elements arranged in a first pixel grid; and light-emitting elements. The light-emitting elements are arranged to form a second pixel grid. They emit light in a frequency range for which the sensor layer is at least partially transparent, with the result that light emitted from the contact surface in the direction of an area of skin can be coupled into it. The light-emitting elements can be actuated individually or in groups and thus switched on and off, with the result that these light-emitting elements can be actuated for the representation of visual information in dependence on intensity values determined by the light-sensitive sensor elements for display on the contact surface.

20 Claims, 7 Drawing Sheets

(56) References Cited

U.S. PATENT DOCUMENTS

| | | | |
|---|---|---|---|
| 5,828,773 A † | 10/1998 | Setlak | |
| 6,128,399 A | 10/2000 | Calmel | |
| 6,327,376 B1 | 12/2001 | Harkin | |
| 7,366,331 B2 | 4/2008 | Higuchi | |
| 7,379,570 B2 | 5/2008 | Shyu et al. | |
| 8,264,530 B2 † | 9/2012 | Morin | |
| 9,202,100 B2 | 12/2015 | Wolfer et al. | |
| 2002/0163601 A1 | 11/2002 | Min et al. | |
| 2002/0180585 A1 | 12/2002 | Kim et al. | |
| 2003/0174870 A1 | 9/2003 | Kim et al. | |
| 2003/0215117 A1* | 11/2003 | Hata | G06K 9/0004 382/124 |
| 2004/0252867 A1* | 12/2004 | Lan | G06K 9/0004 382/124 |
| 2005/0213173 A1 | 9/2005 | Sasaki et al. | |
| 2005/0229380 A1 | 10/2005 | Deconde et al. | |
| 2008/0106591 A1* | 5/2008 | Border | H04N 7/144 348/14.01 |
| 2012/0321149 A1* | 12/2012 | Carver | G06K 9/0004 382/124 |
| 2013/0120760 A1* | 5/2013 | Raguin | G01B 11/24 356/612 |
| 2014/0079300 A1 | 3/2014 | Wolfer et al. | |
| 2015/0074615 A1* | 3/2015 | Han | G06K 9/00033 715/863 |
| 2017/0220145 A1* | 8/2017 | Ludwig | G06F 3/041 |

FOREIGN PATENT DOCUMENTS

| | | | | |
|---|---|---|---|---|
| EP | 1104908 A1 * | 6/2001 | | G06K 9/00046 |
| EP | 2 711 869 A2 | 3/2014 | | |
| WO | WO 2012/158950 A1 | 11/2012 | | |

\* cited by examiner
† cited by third party

DEVICE AND METHOD FOR OPTICAL IMAGING OF PRINTS OF SKIN PARTS WITH BLOOD CIRCULATION

PRIORITY CLAIM

The present application claims priority to German Patent Application No. 102015115381.5 filed on Sep. 11, 2015, which said application is incorporated by reference in its entirety herein.

FIELD OF THE INVENTION

The invention relates to a device and a method for the optical capture of prints of areas of skin of human autopodia or parts thereof supplied with blood. Such a device comprises, from the direction of an area of skin that is to be placed on, for example from the direction of a person who is to place a finger or a hand on a fingerprint sensor, a contact surface for placing on at least one area of skin. The device comprises, in addition, a composite with a sensor layer, in which, in a first pixel grid, light-sensitive sensor elements with pre-determined lateral dimensions are arranged. The device comprises, in addition, several light-emitting elements.

BACKGROUND OF THE INVENTION

The identification and recording of people via biometric features is becoming increasingly important. The fingerprint and/or handprint plays an important role alongside other recordable biometric features. On the one hand, there are systems which are used to verify biometric features in which there must therefore be a match with stored features, for example in order to enable entry or access control. Other systems are used for identification by searching and storing in reference databases, for example in the case of border controls at airports or in the case of identity-checking by the police. For the latter systems there is a large number of requirements in terms of the quality, the resolution and the faithfulness to the original of the captured images of the skin textures. Not least because of the high demands of organizations entrusted with identity-checking measures, such as for example the Federal Bureau of Investigation (FBI), there is a high degree of standardization with these systems in order, on the one hand, to ensure as definite an identification as possible and, on the other hand, to make data sets which were captured by different systems comparable. For example, such systems must have a resolution of at least 500 ppi, which corresponds to a pixel pitch of 50.8 µm. In addition, particular demands are made on the contrast transfer function (CTF), the signal-to-noise ratio (SNR) and the distortion. Finally, the color scale must comprise at least 200 greyscale values and the field of view must be illuminated as homogeneously as possible both in the immediate vicinity of the pixel and in the image as a whole.

All of the demand criteria require a balanced and high-quality system design. In the case of an optical system, this means, for example, that not only the acquisition sensor or acquisition sensors must satisfy the demands but also the illumination and all of the other components necessary for the image generation.

For recording finger and handprints which fulfil the named high quality demands, at the present time, optical arrangements are predominantly used which operate according to the principle of disturbed total internal reflection. For this, a prism is applied, the surface of which provided for capturing the print must be larger than the surface required for capturing the print because of mechanical and optical demands. The size of the prism resulting from this often as a larger component in the capturing channel has a decisive influence on the minimum overall size and the minimum weight of a device. On the other hand, however, the high image quality permits a rapid and reliable recording and identification of the people, in particular in the case of applications where, in addition to forensic accuracy, a high throughput of people also plays a role, such as for example in the case of border controls. In addition to the overall size and the weight already mentioned, there are further disadvantages in the necessary use of complex mechanical components and in a technically complex and time-consuming assembly and calibration. The user guidance in the case of such devices takes place via information which is presented outside the contact surface, such as e.g. by an adjacent screen. During the capture of skin prints, the person must therefore switch their view repeatedly between the contact surface and the screen.

Miniaturized arrangements with imaging optical systems, as are described for example in U.S. Pat. No. 7,379,570 B2, do not generally satisfy the high standards which are specified for example by the FBI and still limit a further miniaturization of the devices because of the optical beam path. Ultrasonic or piezoelectric sensors, as are known for example from U.S. Pat. No. 4,394,773, and capacitive sensors, as are described for example in U.S. Pat. No. 5,325,442, can capture fingerprints non-optically. Devices based on ultrasonic sensors are not yet on the market. Capacitive sensors, in turn, to date exist only for one or two finger pictures. To date, all of the non-optical principles have the disadvantage that no information can be directly displayed on the sensor. Membrane keyboards, as are described for example in US 2005/0229380 A1, do not fulfil the necessary criteria.

In order to combine the advantage of high image quality which can be achieved with disturbed total internal reflection with small overall size, approaches were already described in US 2012/0321149 A1. The fingerprint sensor disclosed there, in which the finger is placed on a TFT display, captures a fingerprint and transmits this via an electronic system to a computer system. The brightness profile corresponding to the fingerprint forms—as in the case of arrangements with prisms—in that the epidermal ridges lying on the surface of the TFT display disturb the internal reflection of the light from the light source, while in the papillary lines, i.e. the skin valleys, no contact occurs between skin and TFT surface and there the light from the light source is reflected internally on the surface of the TFT. A negative image of the fingerprint image thus forms on the light-sensitive areas of the TFT. However, this solution assumes that the upper substrate has a minimum thickness so that the light can strike the light-sensitive areas of the TFT. In addition, it is necessary for the illumination to fulfil certain requirements with regard to the direction of incidence and aperture angle, which significantly increases the technical complexity of the illumination and also the space requirement thereof. The embodiments of illuminations described in US 2012/0321149 A1 are not suitable or are only suitable to a limited extent for large capture surfaces for more than one or two fingers since they are associated with great complexity.

A further concept for a flat construction without an imaging optical system is described in U.S. Pat. No. 7,366,331 B2. Here, the light is coupled into the finger laterally by means of a flat illumination and scattered in the adjacent part of the skin. The finger is in contact with a transparent layer between finger and sensor. Thus light preferably couples out of the skin peaks into this layer and can then be detected by the flat sensor. This concept requires illumination wavelengths within the transparency range of the finger, i.e. in particular in the near and mid-infrared range, and thus involves considerable ambient light problems. Although the recommended use of infrared filters and infrared illumination reduces these problems, the sensitivity of usual sensors is then lower and the absorption of the finger is higher, which worsens the signal-to-noise ratio. Optionally used narrow-band spectral filters must be adapted in accordance with the wavelength of the illumination and generate additional technical complexity. The lateral illumination causes problems for the homogeneity of the illumination, in particular it prevents the simultaneous capture of several fingers, since these would shadow each other. This concept is therefore only suitable for capturing one finger. In addition, a light shield is necessary in order to prevent portions of the illumination arriving directly in the sensor. The lateral illumination and the light shield increase the size of the device and it becomes more complex, less flexible and more prone to errors.

In EP 2 711 869 A2, an arrangement and a method for capturing fingerprints are described. The user who places a finger or a hand on a capture surface obtains information by means of pictograms, images or the like on a display unit which is close but spatially separate from the capture surface. This information reveals, for example, whether, for example, the placement position and/or the contact pressure are acceptable or, for example, whether all of the fingers are lying on or whether some fingers are missing, if the whole hand is to be captured. Because of the spatial separation of the capture surface and display it is cumbersome for the person whose prints are to be taken to correct the position of the autopodia on the capture surface, since the transmission of the image represented on the display surface does not take place immediately and intuitively on the action or a required movement for example of individual fingers. Furthermore, because of the spatial separation of the capture surface and the display unit, there is the risk that the user does not place his fingers on the contact surface but on the display. That takes place in particular when the representation on the display shows the fingers to be captured. Capturing rolled fingers requires particularly great attention during the capturing process since a satisfactory fingerprint picture is only possible with a continuous speed and continuous pressure. This is usually achieved in that the capturing process is represented on a display in real time. In the case of the spatial separation of the capture surface and display it is very difficult for the user to synchronize the capturing process and the display. In practice, this leads too often to flawed fingerprint pictures which must be repeated.

SUMMARY OF THE INVENTION

The object of the invention is therefore to further develop an arrangement of the type described at the beginning and a method for capturing prints of autopodia to the effect that it is easier for a person whose fingerprints for example are to be captured to identify how the placement of the fingers must be corrected in order to obtain a satisfactory result for a print. More local and more intuitive feedback is to be given to the person than is possible with the state of the art, with the result that in this way both the delay time at the capturing device can be shortened and flawed pictures are reduced.

This object is achieved in the case of a device of the type described at the beginning in that several light-emitting elements are arranged next to each other. The light-emitting elements are (i) arranged in the shape of a grid in a second pixel grid, (ii) formed emitting light in a frequency range for which the composite is at least partially transparent, with the result that the light through the contact surface in the direction of an area of skin can be coupled into the latter, and (iii) can be actuated and thus switched on and off individually or in groups. The distance from each light-sensitive sensor element to the contact surface is less than the pixel pitch of the first pixel grid, preferably less than half of this pixel pitch. Through the latter measure, the information of different objects can effectively be prevented from overlaying each other in one pixel, i.e. no cross-fading of different items of object information takes place.

Since the light-emitting elements are arranged in the shape of a grid in a second pixel grid and can be actuated individually, it is possible, in the immediate vicinity of the placed-on finger, to represent corresponding visual information depending on the recorded intensity values, which the person whose fingerprints for example are to be taken detects immediately on looking at his fingers and can react appropriately, should this be necessary. Examples of such visual information are given in the description of the method according to the invention which can in particular use the arrangement according to the invention.

In addition or as an alternative to the representation of visual information it is also possible, in a corresponding embodiment of the device, to emit acoustic signals or haptic signals—for example in partial areas of the contact surface—so that a user can react to them. Haptic or tactile signals are particularly suitable for people with limited vision.

In a preferred embodiment, a spectral filter formed as high-pass filter is arranged between the contact surface and the composite. The threshold wavelength of it is pre-determined in dependence on the optical absorption behavior of the areas of skin supplied with blood; below the threshold wavelength, the spectral filter is essentially transparent at least in the visible optical range. In addition, the spectral filter is at least partially transparent for the light emitted by the light-emitting elements.

There are different possibilities for the arrangement of the light-emitting elements. For example, the light-emitting elements can be arranged outside the composite or in a separate illumination layer in the composite, wherein the illumination layer is then arranged underneath the sensor layer, i.e. on the side facing away from the spectral filter. The light-emitting elements can be formed actively or passively emitting light; in the arrangement in a separate illumination layer it is particularly advantageous to form the illumination layer as an LC display—i.e. with passively light-emitting elements—and with background illumination. Such elements are easy to produce and actuate, wherein here the transmissivity of the individual pixels of the LC display is controlled.

In another embodiment, the light-emitting elements can also be formed by mobile communication devices—for example tablets or smartphones. Here, the mobile device serves as illumination layer, which is arranged underneath the sensor layer. In this way, a particularly compact construction can be achieved for mobile use as well as a simple realization of visual or haptic information via the mobile device.

The background illumination can be dispensed with if the light-emitting elements are formed emitting light actively, for example as LEDs or OLEDs. The thickness of the device and the complexity of production can be reduced in this way.

A further reduction of the thickness and of the complexity of production is possible if the light-emitting elements are integrated into the layer with the light-sensitive sensor elements, i.e. the sensor layer itself. The light-sensitive sensor elements and the light-emitting elements then lie in one plane. Here too, the light-emitting elements are preferably formed as actively light-emitting elements, for example as LEDs or as OLEDs.

The pixel grids do not necessarily have to have the same dimensions since such high demands are not placed on the closeness of the mesh or the resolution of the second pixel grid with the light-emitting elements as are placed on the first pixel grid of the light-sensitive sensor elements. The finer the second pixel grid is, however, the higher the resolution and the more accurately the visual information can be represented.

The first and the second pixel grids preferably lie in one plane and have identical pixel pitches. The light-emitting elements are then arranged in the centers of the pixels of the first pixel grid and the light-sensitive sensor elements are arranged in the centers of the second pixel grid. In this way, a particularly thin construction can be realized and, because of the corresponding pixel size, the representation is moreover particularly accurate.

In a further, particularly preferred embodiment, the light-emitting elements are identical to the light-sensitive sensor elements and they are particularly preferably formed as bidirectional LEDs. This reduces the technical complexity further and also reduces the weight and the power consumption, which increases the portability of such a device and thus broadens the range of applications, for example identity-checking measures can be carried out more easily in situ.

The threshold wavelength of the optional spectral filter is preferably pre-determined in dependence on the optical absorption behavior of the areas of skin supplied with blood. The haemoglobin in the blood is predominantly responsible for the absorption behavior and is essentially transparent to light above a wavelength of approximately 600 nm but on the other hand absorbs strongly for wavelengths below this, in particular in the green and blue wavelength ranges. The threshold wavelength of the spectral filter is therefore preferably in a range of 600±50 nm or 575±25 nm, for example 575 or 600 nm. The spectral filter is then essentially transparent only for blue and green light. Since, however, the finger is opaque to blue and green light, disturbing ambient light is noticeable at the most at the edges of the finger. This makes it possible to determine more precisely whether the autopodia to be captured lie in the correct positions or whether there is the correct contact pressure which is necessary for an optimal contrast to be formed between skin peaks and skin valleys.

In addition, the invention relates to a method for capturing prints of areas of skin of human autopodia or parts thereof supplied with blood, which can be carried out in particular with the device described previously. In the case of such a method, at least one area of skin, the print of which is to be taken, is brought close to a contact surface of a device for capturing such prints and is placed on it. Several light-emitting elements that are arranged in the shape of a grid in a second pixel grid and can be actuated individually or in groups are switched on or off to illuminate the at least one area of skin. In the case of passive light-emitting elements, switching on corresponds to switching to transparent to light. The light emitted by the light-emitting elements passes through a composite with light-sensitive sensor elements of pre-determined lateral dimensions arranged in a first pixel grid, through an optional spectral filter and through the contact surface onto and into at least one area of skin. There, depending on the nature and position of the area of skin, depending on whether it is, for example, a skin peak or a skin valley, the light is deflected and possibly coupled out again in the direction of the contact surface. The coupled-out light passes through the contact surface again and is directed onto the light-sensitive sensor elements. There, the intensity of the light is recorded, wherein the distance from each light-sensitive sensor element to the contact surface is less than the pixel pitch of the first pixel grid, preferably less than half of the pixel pitch. The intensity values recorded and determined by the light-sensitive sensor elements are then supplied to an image processing, which can be integrated into the device. As a result of image processing algorithms which are known per se, different parameters are obtained which assess the quality and correctness of the picture, in particular at least information is obtained as a result about the position, the shape and/or whether the contact pressure of the at least one area of skin was correct, too high or too low, which can be recognized in the contrast as a rule. In dependence on the determined result, the light-emitting elements are then actuated and switched on or off. Visual information is represented by the light-emitting elements and displayed on the contact surface, with the result that an observer—as a rule the person whose hand or finger is placed on—sees it right next to the affected areas of skin.

If, for example, several fingers are placed correctly and the contact pressure was also correct, this can, for example, be indicated with a green contour which is shown directly around the finger. An incorrectly positioned finger can, for example, be surrounded by a red contour; in addition, it can be indicated with arrow symbols in which direction the finger is to be moved, or, for example, with a weight symbol and an arrow pointing downwards or upwards if the contact pressure needs to be increased or decreased. In the case of a corresponding embodiment of the device used to carry out the method, an acoustic and/or tactile/haptic feedback can also be given to the person whose areas of skin are to be recorded. For example, for an incorrectly placed finger, the correct position can be indicated by a localized vibration of the corresponding area—this can be achieved, for example, with the aid of piezoelectric elements. The user is then prompted to shift his finger in such a way that the entire area that is to be captured lies on the vibrating, localized surface. As soon as the correct position is reached, the vibration is halted. It is therefore indicated or made perceptible, in particular in dependence on the determined result, whether a change in the position and/or the contact pressure of the area of skin is required.

The silhouette of the autopodia can also be displayed to the user before he has brought the area of skin into contact with the contact surface so that he knows exactly where and how these are to be placed on. If he does not place them in the correct position or with the correct contact pressure—in each case within pre-determined tolerances—on the contact surface, information is likewise preferably displayed or communicated to the user on the contact surface of the manner in which a correction is to be carried out. When the user has carried out the corrections successfully, this can be confirmed such that the user can perceive it actively and positively.

In a further preferred embodiment, the light-sensitive elements are actuated in such a way that they already capture signals during the approach of the area of skin to be captured, for example the shadow or the contour of a hand. These signals are analyzed by an image processing algorithm so that it can be established whether it is actually an object to be captured. In the case that the approach of an area of skin to be recorded is verified, further steps are initialized. For example, the illumination of the device—the contact surface serves at the same time as a screen—can be activated and, for example, a position can be shown to a person on which he is to place his hand. This can take place, for example, with a contour of a hand represented in white light, the individual fingers of which are distinguished. After or during the measurement of the intensity values by the light-sensitive sensors, the white light of the contour can then be switched to green or red light in dependence on the recorded measured values.

In a preferred embodiment of this method, signals captured during the approach of the area of skin are compared with signals captured when an area of skin is placed on. The color of an area of skin changes when it is exposed to pressure, in this case when the area of skin is pressed onto the contact surface. This effect is exploited in order to detect imitations. Spectral information can be captured via the sensor through defined illumination colors. When it is recorded that an area of skin is approaching, the idle state switches to an approach state. In this, a first image is already captured, with a particular illumination color, i.e. first spectral signals are recorded. Pictures with further illumination colors follow if desired. When the area of skin is placed on, the approach state switches into a capture state and, after correct positioning and with correct exertion of pressure, a further image, or optionally several further images with different illumination colors, are captured. Spectral signatures of the area of skin before and after contact with the contact surface are generated. The difference between the two signatures is specific to living skin. Imitations can thus be identified. If the difference between the two spectral signatures is not within a pre-determined interval, the capturing process is terminated as an attempt to deceive.

Similarly, in an alternative embodiment of the method which can be easily combined with that previously described, it is possible to set the device in such a way that, in dependence on the position determined on the contact surface, program commands are carried out, for example programs are started, programs are stopped or specific settings are made in programs. In this case, the device can be used not only as a device for capturing fingerprints but also as a touch-sensitive panel, for example as a touchpad or smartphone. In other words, the functionality of the fingerprint recording can be easily combined with that of a smartphone or similar devices. In this way, for example, a user interface for a device purely conceived as a fingerprint capturing device can also be realized. The device can, in this way, be realized in a particularly compact and user-friendly manner.

It is understood that the features named above and those yet to be explained below can be used not only in the stated combinations but also in other combinations or alone without departing from the scope of the present invention.

BRIEF DESCRIPTION OF THE DRAWINGS

The invention is explained in yet more detail below by way of example with reference to the attached drawings which also disclose features essential to the invention. There are shown in.

DETAILED DESCRIPTION

Figure 1A:
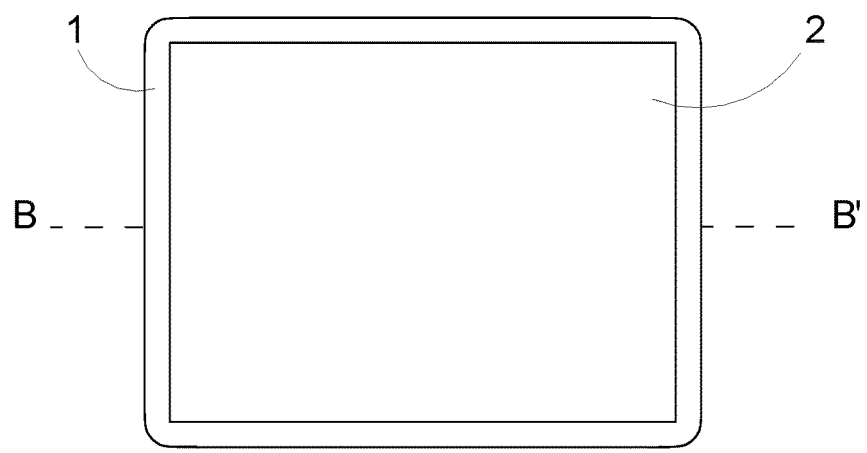
FIGS. 1A, 1B depict embodiments of a basic structure of a device for capturing prints of areas of skin supplied with blood.

In FIG. 1A, first of all the basic design of a device for capturing prints of areas of skin of human autopodia or parts thereof supplied with blood is represented.

FIG. 1A shows a top view onto a device for capturing such prints. An observer or a person whose fingerprints need to be taken also looks at the device from this direction and the areas of skin the prints of which are to be taken are approached from a solid angle region around the surface of the device. First of all, only a frame 1 and a protective layer 2 can be identified from this direction. The protective layer 2 is optional and prevents the optical components lying below it from being dirtied or damaged. The device can be formed, for example, as a smartphone or as a tablet or be integrated into one such.

Figure 1B:
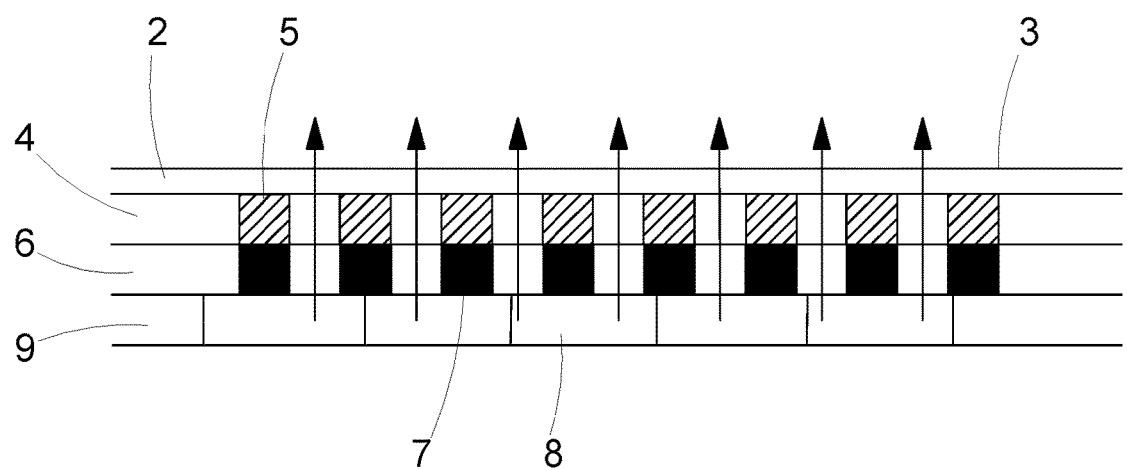

In FIG. 1B, part of a section through the device designed as a composite is shown along a line B-B' in a plane perpendicular to the plane of the page. The upper side of the protective layer 2 forms a contact surface 3. On the other side of the protective layer 2, facing away from the contact surface 3, a spectral filter 4 formed as a high-pass filter is optionally arranged. The threshold wavelength of the spectral filter 4 is pre-determined in dependence on the optical absorption behavior of the areas of skin supplied with blood; it is advantageously in a range between 500 and 650 or between 550 and 600 nm, preferably for example 550 nm, 575 or 600 nm. Light with wavelengths above the threshold wavelength, in other words, light with frequencies below a threshold frequency corresponding to the threshold wavelength, is blocked by the spectral filter 4. Here, the spectral filter 4 is formed as an array of individual filter elements 5 but it can also be formed continuous. The advantage in forming the spectral filter from individual filter elements 5 is that all colors of the visible spectrum can then pass through the spectral filter layer for the display of information and are thus visible to the user, whereas, with a continuous spectral filter layer 4, only light with the wavelengths for which the spectral filter 4 is transparent can be used for the representation of information. For example, at a threshold wavelength of 550 nm, red light can no longer be used for the representation of information, which can be disadvantageous for intuitive comprehension by a person using the device.

A sensor layer 6 with light-sensitive sensor elements 7 arranged in a first pixel grid is arranged underneath the spectral filter 4. The sensor elements have pre-determined lateral dimensions which permit a resolution of at least 500 ppi. The distance from each sensor element 7 to the contact surface 3 is less than the pixel pitch of the first pixel grid. In this embodiment, the filter elements 5 are placed precisely above the sensor elements 7, with the result that actually only light with a wavelength smaller than the threshold wavelength is recorded, while for the representation, light of the whole optical spectrum can be used.

An illumination arrangement—here represented simplified—is arranged underneath the light-sensitive sensor elements 7. Here, this comprises several actively light-emitting elements 8 arranged next to each other. These are arranged in the shape of a grid in a second pixel grid. Here, the second pixel grid has a different pixel pitch from the first pixel grid. The actively light-emitting elements 8 emit light in a frequency range for which the optional spectral filter 4 and the sensor layer 6 are at least partially transparent, with the result that light emitted from the contact surface 3 in the direction of an area of skin can be coupled into it. In addition, the light-emitting elements 8 can be actuated individually or in groups and thus switched on and off. The representation in FIGS. 1B and 1n the following figures is not to scale in this regard and serves only for a better understanding of the structure. Here, the light-emitting elements 8 are arranged in a separate illumination layer 9 and are formed actively light-emitting. The emission direction is indicated by the arrows. Instead of actively light-emitting elements 8, passively light-emitting elements can equally be used with a separate illumination arrangement, for example LC displays with background illumination, wherein it is not the background illumination which is switched on and off but the transmissivity of the passively light-emitting elements.

Figure 2:
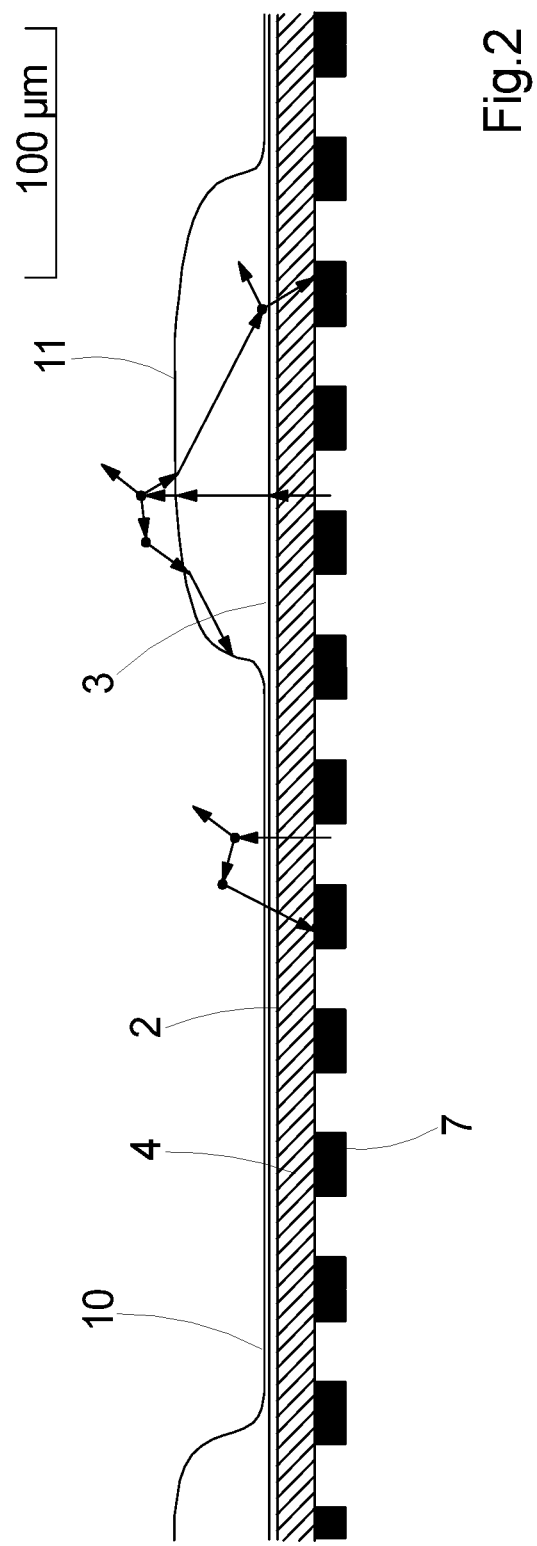
FIG. 2 depicts the optical ratios for light which is used for the capturing.

FIG. 2 serves for better understanding of the mode of operation of the device and of a method for the optical capture of prints of areas of skin of human autopodia or parts thereof supplied with blood. Here, the representation of an active or passive illumination arrangement, which is, of course, present, was omitted for reasons of clarity. The representation is, at least in the lateral direction, approximately to scale. Here, the optional spectral filter 4 is formed for simplicity as a continuous layer. FIG. 2 shows the light paths during the illumination of skin peaks 10—the papillary ridges of fingers or other areas of skin of the hand—and skin valleys 11—the papillary lines of the skin. Skin peaks 10 lie directly on the contact surface 3; without the medium of air to pass through, light enters directly into the skin and is scattered there. A large part of the scattered light is reflected and coupled out again in the direction of the contact surface and directed through the contact surface 3 onto the light-sensitive sensors 7. There, the intensity of the light is recorded. In the picture of the finger- or handprint these areas of the skin peaks 10 appear bright.

Between the sensor layer 6 and the skin valleys 11, on the other hand, the light has to cover a path through air; the losses through reflection and scattering are higher through refraction and reflection on several boundary surfaces, in particular for the light scattered back from the area of skin, with the result that these areas appear with reduced brightness compared with the skin peaks 10. In this way, it is possible to obtain an exact recording of a finger- or handprint. The intensity values determined by means of the light-sensitive sensor elements are supplied to an image processing. With the aid of image processing algorithms, as are known in the state of the art and are also named for example in EP 2 711 869 A2, different parameters are determined for describing the fingerprint, for example the position of the finger or the hand, the shape, the contrast and/or the contact pressure of the at least one area of skin on the contact surface. In dependence on the determined result, the light-emitting elements 8 are then actuated and switched on or off, wherein this also includes a change in the emitted color value and/or the brightness. Visual information which is visualized for a user on the contact surface 3 is then represented by the light-emitting elements 8. In contrast to the device described in EP 2 711 869 A1, the device therefore also has the function of a screen. The visual information can, for example, be to indicate in which direction an incorrectly positioned finger must be shifted, whether more or less contact pressure must be exerted, or also whether the picture was satisfactory. The contact surface 3 can also be used as an optically operating touchpad; in dependence on the determined position of the finger or of the hand, particular commands for controlling programs can then also be executed, if, for example, diverse selection possibilities for starting the program, ending the program or changing the options of a program had been represented at pre-determined positions before contact of the fingers or the hand.

In addition, the method can also be carried out such that sensor elements 7 can already capture signals as the area of skin approaches, these are analyzed by an image processing algorithm and, in the case that the approach of an area of skin to be recorded is verified, further steps are initialized. These further steps can, for example, be changing display elements, activating a fingerprint picture, activating audio signals or the like. An example of this is described in connection with FIGS. 10A and 10B.

Figure 3:
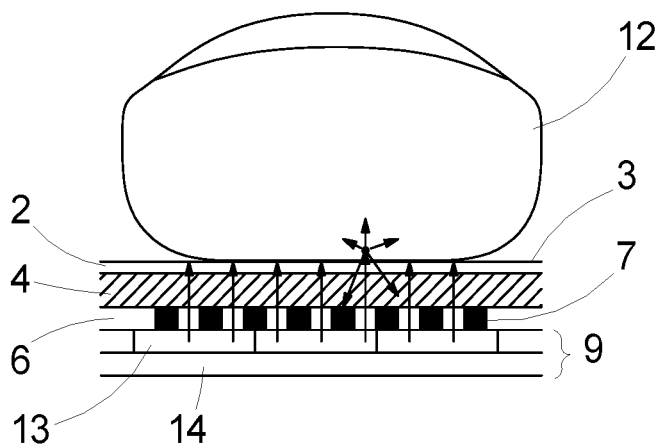
FIGS. 3 to 5 depict further embodiments of the device of FIGS. 1A, 1B.
Figure 4:
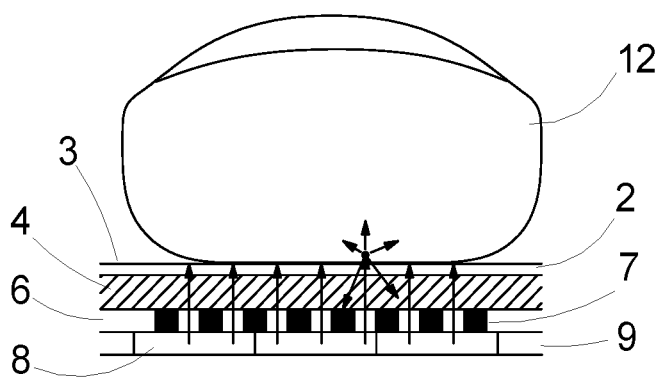
Figure 5:
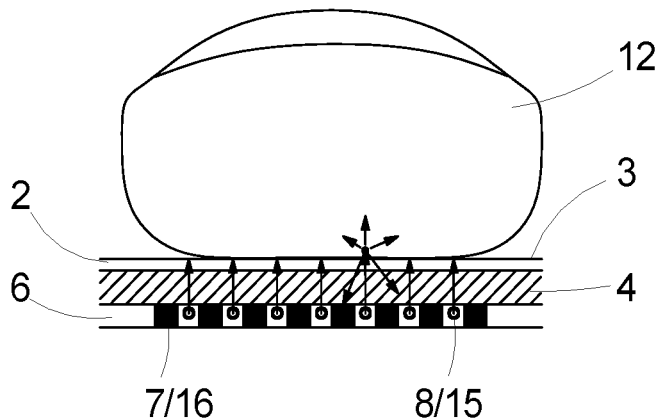

Further possible embodiments of a device for capturing prints of areas of skin supplied with blood, with which the described method can also be realized, are represented in FIGS. 3-5. The area of skin to be analyzed is symbolized here by a finger 12; for simplicity, there is no differentiation between skin peaks 10 and skin valleys 11, since only different layouts are shown here.

The devices represented in FIGS. 3 to 5 differ essentially only in the way in which the light-emitting elements are realized. Here, the optional spectral filter 4 is represented in each case as a continuous layer but in each of the embodiments it can either not be present at all or be composed of individual filter elements 5, as were already described in connection with FIG. 1B. In the devices shown in FIG. 3 and FIG. 4, the light-emitting elements are arranged in a separate illumination layer 9. In the embodiment shown in FIG. 3, passively light-emitting elements 13 are provided which can be illuminated via background illumination 14 and can be switched between the "transmissive" and "opaque" states. Intermediate grades are also possible; this occurs through corresponding actuation, for example in that the polarization properties of the transmissively switchable elements are varied and the illumination takes place with polarized light. The illumination layer 9 can then, for example, comprise an LC display which contains the passively light-emitting elements 13, with background illumination 14.

The embodiment shown in FIG. 4 corresponds essentially to the representation shown in FIG. 1B; here, the light-emitting elements are formed as actively light-emitting elements 8, for example as LEDs or OLEDs. The light-emitting elements are arranged in an individual illumination layer 9.

In other embodiments, the light-emitting elements can, if they are formed as actively light-emitting elements 8, be integrated into the sensor layer 6. First and second pixel grids then preferably lie in one plane though they do not have to have the same pixel pitch.

In the embodiment shown in FIG. 5, the first and second pixel grid lie in one plane; here, the two pixel grids have identical pixel pitches, wherein here the light-emitting elements are arranged in the centers of the pixels of the first pixel grid and the light-sensitive sensor elements are arranged in the centers of the second pixel grid. Other embodiments provide a pixel pitch for the light-emitting elements which is twice as large. Here, for example LEDs or OLEDs are used as light-emitting elements. Alternatively, it is also possible to form the light-sensitive elements 7 as opaque elements 16 and to replace the actively light-emitting elements 8 by bidirectional elements, i.e. to replace the actively light-emitting elements and simultaneously the light-sensitive sensor elements 7 by bidirectional light elements, for example by bidirectional LEDs 15. These make a particularly compact construction possible.

The method sequence and the handling of user errors is explained by way of example with reference to FIGS. 6A to 9B. The device is symbolized in each case by the screen, i.e. the frame 1 and the protective layer 2, which a user also perceives. Through the possibility of directly representing information for the user on the contact surface 3, the user can be prompted and instructed for optimal positioning—as shown in FIGS. 6A, 6B and 9A, 9B—and to exert an optimal contact pressure—as shown in FIGS. 7A, 7B and FIGS. 8A, 8B. If the position and/or contact pressure of the autopodia is/are set in accordance with the presets, i.e. the correction has been carried out by the user, this can be positively confirmed.

Figure 6A:
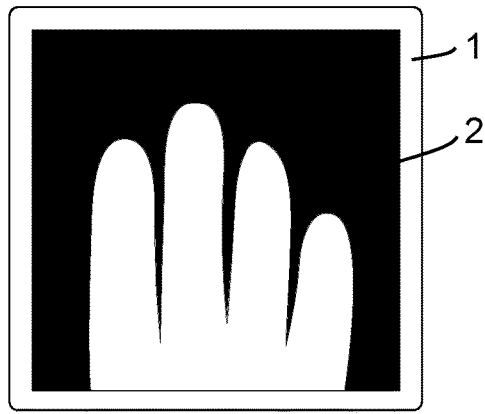
FIGS. 6A, 6B depicts a display on a capture device for the correct sequence of the capturing process.
Figure 6B:
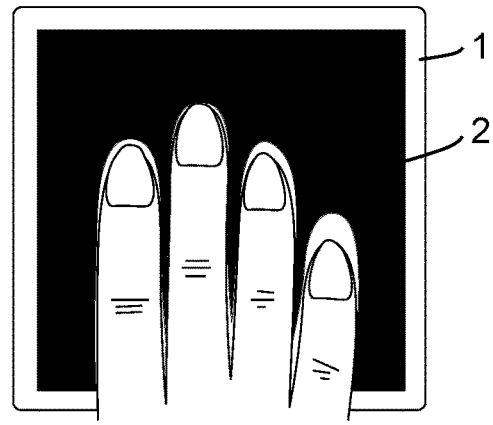

The basic sequence of the method is represented in FIGS. 6A and 6B. FIG. 6A shows the device in the capture-ready state. The silhouette of the autopodia which are to be captured is represented on the contact surface 3 serving simultaneously as screen. The user thus obtains exact information about where the autopodia—here four fingers of one hand—are to be placed. He also obtains information about how they are to be placed; for example, it is thus attempted to prevent an incorrect placement in the form of undesired rotation. In FIG. 6B, the user's fingers placed correctly on the contact surface 3—or the protective layer 2—provided can be seen.

Figure 7A:
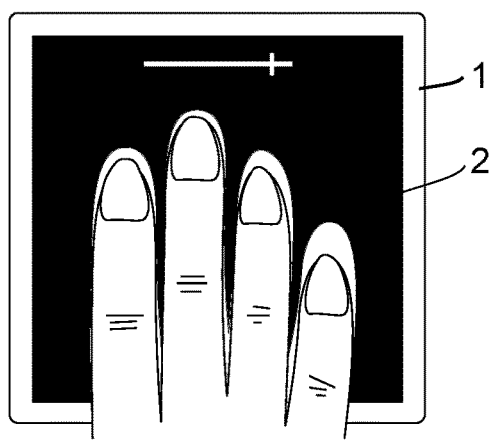
FIGS. 7A, 7B, 8A, 8B, 9A, 9B and 10A, 10B and 10C depict the sequences of the capturing process with correction prompts.
Figure 7B:
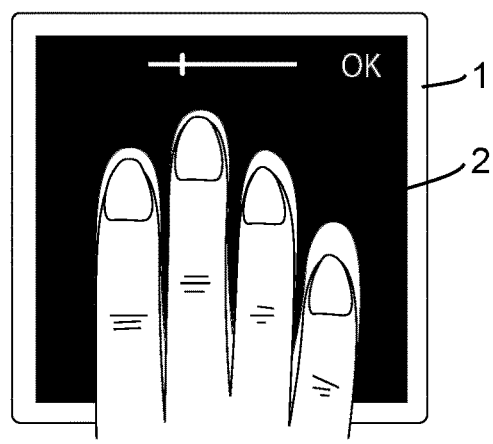

FIGS. 7A and 7B show an embodiment of the method in which the user is instructed to exert a correct contact pressure. The display rendered by way of example as a bar in the upper area of the contact surface 3 above the fingers symbolizes the amount of contact pressure with which the fingers are contacting the contact surface 3. In FIG. 7A, an example can be seen that signals, by means of the bar, that the contact pressure of the fingers is too great. If the contact pressure is lowered, the bar display will indicate the lower value. If the value corresponds to the presets, this is confirmed, as represented in FIG. 7B by the text "OK". Too low a contact pressure can also be dealt with in such a manner. For more intuitive understanding by the user, the bar display can also be colored and, for example, indicate a contact pressure which is too high with the color "red", too low with the color "blue" and correct with the color "green".

Figure 8A:
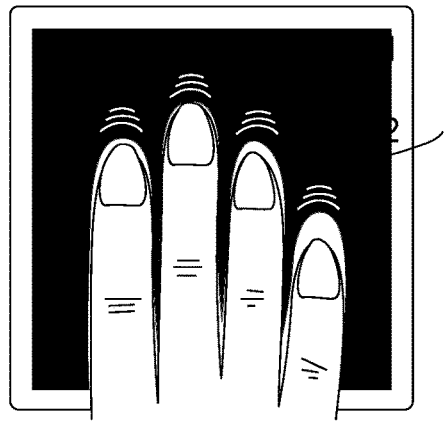
Figure 8B:
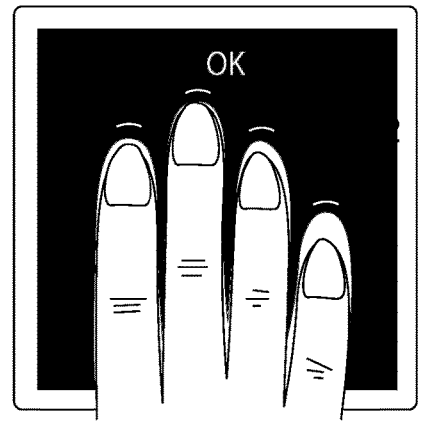

FIGS. 8A and 8B show an alternative embodiment of the method with the prompt for correction for fingers which are placed on too firmly or too weakly. Compared with the variant shown in FIG. 7, the advantage here is that the correction prompt or pressure reading can be represented individually for each of the fingers. FIG. 8A shows several—three—lines above the fingers which are intended to symbolize too high a contact pressure, shown here identically for all fingers for the sake of simplicity. However, this type of representation also permits the display to prompt the user only to correct some or even only one specific finger, in that the information to be represented, here the number of lines above the fingers, is defined in dependence on the local contact pressure of the finger. The more lines are represented above a finger, the higher its contact pressure is. In the example shown in FIG. 7A, if the user lowers the contact pressure to the required degree, this is positively and actively confirmed via the display. In FIG. 8B, such a confirmation takes place via the representation of the word "OK". Alternatively, the confirmation can also take place passively in that, for example, only the display of the lines disappears. Here too the lines can have different colors in order to enable a more intuitive understanding by the user.

Figure 9A:
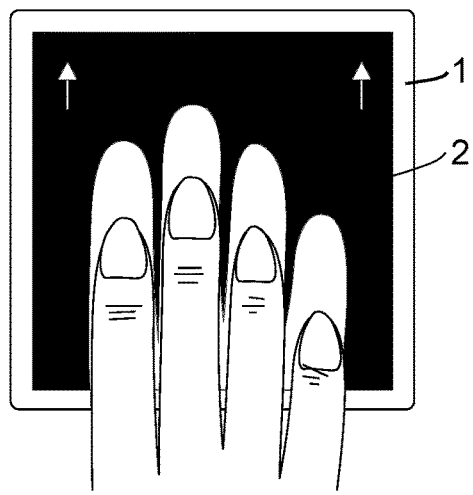
Figure 9B:
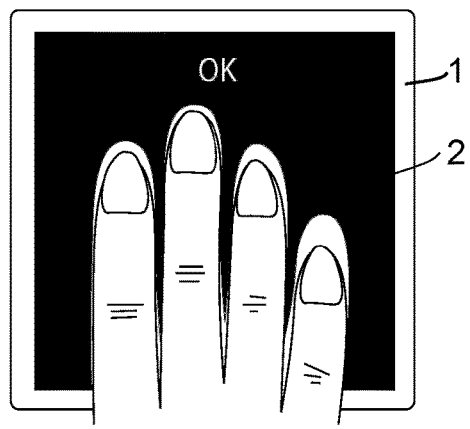

A further preferred embodiment of the method in which the user is instructed to place the autopodia—here again the fingers—correctly and thus to contribute to the optimization of the image capture conditions is represented in FIGS. 9A and 9B. If the user does not position the fingers correctly, as represented by way of example in FIG. 9A with fingers lying too far down, he receives the prompt for correct placement through the display of arrows which symbolize the direction in which the fingers need to be shifted. After a successful correction of the finger positions, the user receives positive feedback, in FIG. 9B represented by the display of the word "OK". Here too the display of the arrows can be individualized for each of the fingers. In addition, a combination with the variants in which instructions are given for correcting the contact pressure is easily possible. The instructions for correcting the contact pressure and for correcting the finger position can be shown simultaneously or one after the other. For example, the user can first be guided into the correct position before the contact pressure is corrected. If, for example, the user unintentionally moves one of the fingers again while correcting the contact pressure, this can also be indicated again if it is incorrectly positioned.

Figure 10A:
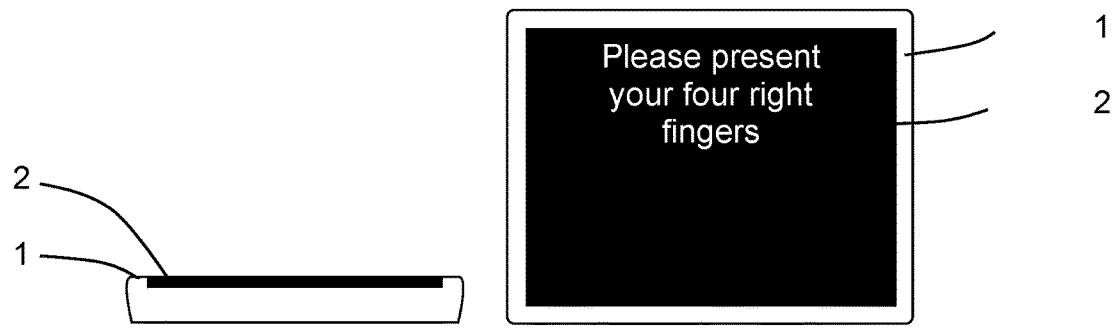
Figure 10B:
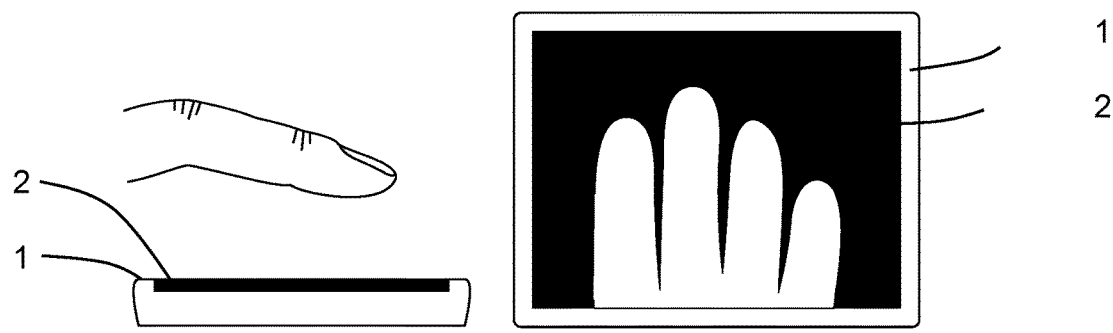
Figure 10C:
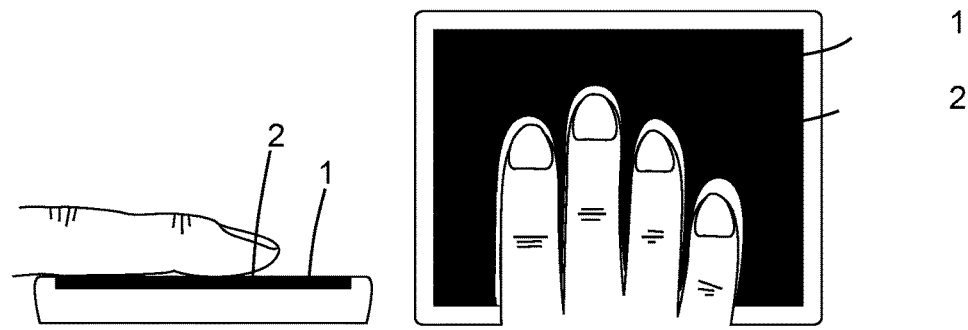

In FIGS. 10A-C a particularly preferred embodiment of the described method is represented in which the light-sensitive sensor elements 7 already capture signals during the approach of the area of skin. In each case, the sensor device is represented from the side on the left-hand side and from above on the right-hand side. In FIG. 10A, the device is represented in a first state, the idle state. The contact surface indicates a prompt to place specific areas of skin—here, as a non-limiting example, the four right fingers. When the fingers approach, this approach is detected by the device and the device switches into another, second state, the approach state, which is represented in FIG. 10B. The contact surface shows the silhouette of the area of skin to be captured. The correct positioning is thus made easier. The user thus firstly gets the feedback that the device is ready for the image capture and secondly he obtains specific information about how and where he is to place his fingers. With the contact of the contact surface, the arrangement switches in turn into a new, third state, the capture state, which is shown in FIG. 10C. The capturing procedure is started, the device is ready to capture an image. Initial checks, such as, for example, whether the fingers are correctly positioned and/or whether the contact pressure is within a pre-determined tolerance range, are included in particular in the capturing procedure. These checks and the optionally accompanying instructions for correction of the positioning and/or the contact pressure were already described in detail in connection with FIGS. 7A to 9B.

The procedure of switching between the three states takes place in dependence on the result of the evaluation of image data which the light-sensitive sensor elements 7 record; the prompts and information for the user take place through representation by the contact surface 3 or through it. The contact surface 3 is typically the side of the protective layer, formed by the protective film 2, facing away from the sensor layer 6.

Figure 11A:
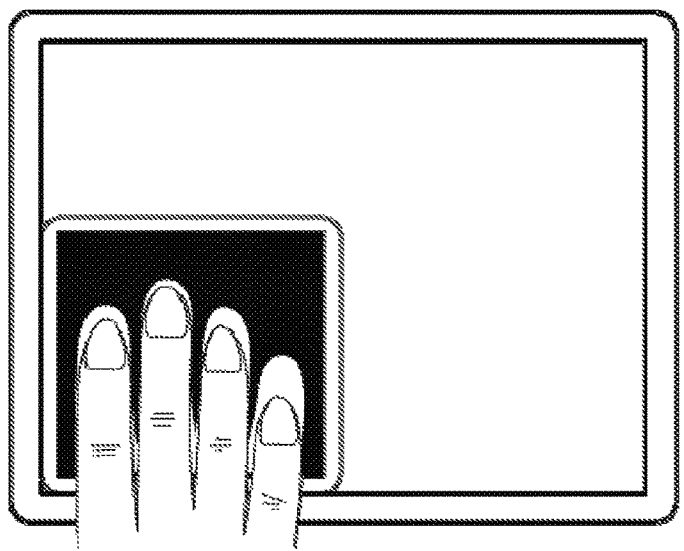
FIGS. 11A, 11B depicts an embodiment in which mobile communication devices are used.
Figure 11B:
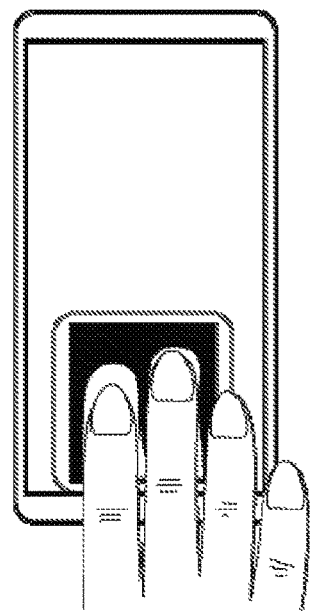

FIGS. 11 A-B finally show devices in which the light-emitting elements are realized by mobile communication devices, here by a tablet computer—FIG. 11A—and by a smartphone—FIG. 11B. The sensor layer 6 is placed flat above the illumination layer. The mobile communication device thus serves simultaneously for illumination, for the display of visual, haptic and/or acoustic information and optionally to control the sensor layer. The sensor layer can be permanently connected to the mobile communication device or can be connected detachable from it. In this way, very flat and mobile devices are realized.

With the previously described method and the associated devices, on the one hand, a particularly compact structure of a fingerprint sensor is possible which, moreover, can be used for many purposes and is portable, and which can give a user instructions which are intuitive to understand for use and for correcting the positioning of the areas of skin the prints of which are to be captured.

LIST OF REFERENCE NUMBERS

1 Frame
2 Protective layer
3 Contact surface
4 Spectral filter
5 Filter element
6 Sensor layer
7 Light-sensitive sensor element
8 Actively light-emitting element
9 Illumination layer
10 Skin peak
11 Skin valley
12 Finger
13 Passively light-emitting element
14 Background illumination
15 Bidirectional LED
16 Opaque element

The invention claimed is:

1. A device for the optical capture of multiple prints of areas of skin of human autopodia or parts thereof supplied with blood, comprising, seen from the direction of an area of skin to be placed on:
  a contact surface configured to be contacted by a plurality of human fingers, each of the human fingers defining at least one area of skin,
  a composite, containing a sensor layer with light-sensitive sensor elements of pre-determined lateral dimensions arranged in a first pixel grid, and
  several light-emitting elements arranged next to each other,
  wherein the light-emitting elements (i) are arranged in the shape of a grid in a second pixel grid, (ii) are formed to emit light in a frequency range for which the composite with the sensor layer is at least partially transparent, with the result that light emitted from the contact surface in the direction of an area of skin can be coupled into the area of skin, (iii) are configured to be controlled to cause a change in an emitted color value or brightness, and (iv) are configured to be actuated and controlled individually or in groups, the actuation and control including controlling so as to display visual information at the contact surface, and
  a distance from each light-sensitive sensor element to the contact surface is less than half of a pixel pitch of the first pixel grid.

2. The device according to claim 1, wherein the light-emitting elements are arranged in a separate illumination layer.

3. The device according to claim 2, wherein the light-emitting elements are formed as passively light-emitting elements.

4. The device according to claim 2, wherein the light-emitting elements are formed by a display of a mobile communication device.

5. The device according to claim 3, wherein the illumination layer comprises an LC display with background illumination.

6. The device according to claim 2, wherein the light-emitting elements are formed as actively light-emitting elements, preferably as LEDs or OLEDs.

7. The device according to claim 1, wherein the light-emitting elements are integrated into the sensor layer, wherein the first and second pixel grid preferably lie in one plane, and/or the light-emitting elements are formed as actively light-emitting elements.

8. The device according to claim 7, wherein the first and second pixel grid have identical pixel pitches and the light-emitting elements are arranged in centers of the pixels of the first pixel grid and the light-sensitive sensor elements are arranged in centers of the second pixel grid.

9. The device according to claim 1, wherein the light-emitting elements are formed identical to the light-sensitive sensor elements.

10. The device according to claim 1, wherein a spectral filter formed as a high-pass filter with a threshold wavelength pre-determined in dependence on the optical absorption behavior of the areas of skin supplied with blood, preferably lying in a range of from 600±50 nm, is arranged between the contact surface and the composite, wherein the spectral filter is at least partially transparent for light emitted by the light-emitting elements.

11. A method for the optical capture of multiple prints of areas of skin of human autopodia or parts thereof supplied with blood, comprising:
  placing a plurality of human fingers having a plurality of areas of skin, the prints of which are to be taken, onto a contact surface of a device for capturing such prints,
  switching several light-emitting elements that are arranged in a shape of a grid in a second pixel grid and can be actuated individually or in groups, on or off to illuminate the at least one area of skin, the actuation of the several light-emitting elements causing a change in an emitted color value or brightness, and
  directing the light emitted by the light-emitting elements through a composite containing a sensor layer with light-sensitive sensor elements of pre-determined lateral dimensions arranged in a first pixel grid and through the contact surface and on and into the areas of skin where the light, depending on the nature and position of the area of skin, is deflected in the direction of the contact surface, directing the light through the contact surface onto the light-sensitive sensor elements and recording the intensity of the light at the light-sensitive sensor elements, and
  wherein a distance from each light-sensitive element to the contact surface is less than half of a pixel pitch of the first pixel grid,
  from intensity values determined by the light-sensitive sensor elements, at least the position, the shape and/or the contact pressure of the areas of skin on the contact surface are determined as a result via image processing algorithms, in dependence on the determined result, the light-emitting elements are actuated and switched on or off and visual information which is displayed on the contact surface is represented by the light-emitting elements.

12. The method according to claim 11, wherein program commands are executed in dependence on the determined position.

13. The method according to claim 11, wherein in dependence on the determined result, it is displayed or made perceptible whether a change in the position and/or in the contact pressure of the areas of skin is required.

14. The method according to claim 11, wherein the light-sensitive elements capture signals as the areas of skin approach, then analyzes the signals using an image processing algorithm and, in the case that the approach of an area of skin to be recorded is verified, further steps are initialized.

15. The method according to claim 14, wherein spectral signals captured during the approach of the areas of skin, in a defined illumination color, are compared with spectral signals captured when the areas of skin are placed on the contact surface, in a defined illumination color, to detect imitations.

16. The device according to claim 6, wherein the actively light-emitting elements comprise LEDs or OLEDs.

17. The device according to claim 7, wherein the actively light-emitting elements comprise LEDs or OLEDs.

18. The device according to claim 9, wherein the light-emitting elements comprise bi-directional LEDs.

19. The method of claim 11, wherein the light deflected in the direction of the contact surface is coupled out again in the direction of the contact surface.

20. The device according to claim 6, wherein the visual information includes information relating to an interaction of the plurality of human fingers with the contact surface.

* * * * *